United States Patent [19]

Mündel

[11] 4,359,649
[45] Nov. 16, 1982

[54] MONOLITHICALLY INTEGRABLE SQUAREWAVE PULSE GENERATOR

[75] Inventor: Gerald Mündel, Glonn, Fed. Rep. of Germany

[73] Assignee: Siemens Aktiengesellschaft, Berlin and Munich, Fed. Rep. of Germany

[21] Appl. No.: 134,880

[22] Filed: Mar. 28, 1980

[30] Foreign Application Priority Data

Mar. 29, 1979 [DE] Fed. Rep. of Germany ....... 2912492

[51] Int. Cl.³ .............................................. H03K 5/01
[52] U.S. Cl. .................................. 307/268; 307/228; 307/290; 328/128; 331/111
[58] Field of Search ................. 331/111; 307/228, 268, 307/290; 328/128

[56] References Cited

U.S. PATENT DOCUMENTS

| | | | |
|---|---|---|---|
| 3,376,518 | 4/1968 | Emmer | 331/111 |
| 3,831,113 | 8/1974 | Ahmed | 331/111 |
| 4,250,464 | 2/1981 | Schade | 331/111 |

*Primary Examiner*—Harold A. Dixon
*Attorney, Agent, or Firm*—Herbert L. Lerner; Laurence A. Greenberg

[57] ABSTRACT

Monolithically integrable squarewave pulse generator having a capacitor acted upon by two bucking constant-current sources, the capacitor having one terminal connected to the two constant-current sources as well as to a non-inverting input of an operational amplifier connected as a Schmitt trigger, and the capacitor having another terminal tied to reference potential, one of the constant-current sources being operative for charging the capacitor, including a third current source connected to the one capacitor terminal connected to the two constant-current sources for aiding the one constant-current source in charging the capacitor, the third current source being responsive to an adjustable potential of the one capacitor terminal; and the Schmitt trigger having an output connected through a decoupling element to signal output of the squarewave pulse generator.

10 Claims, 9 Drawing Figures

MONOLITHICALLY INTEGRABLE SQUAREWAVE PULSE GENERATOR

The invention relates to a monolithically integrable squarewave pulse generator with a capacitor which is acted upon by two bucking constant-current sources, one terminal of the capacitor being connected to the two constant-current source and, in addition, to the non-inverting input of an operational amplifier connected as a Schmitt trigger, and the other terminal of the capacitor being tied to reference potential (ground).

A similar squarewave pulse generator is described in the book "Halbleiter-Schaltungstechnik" (Semiconductor Circuit Engineering) by Tietze-Schenk (1978 edition) on page 443. In accordance with experience, this heretofore known squarewave pulse generator is disadvantageous in that the squarewave pulses provided thereby deviate from the expected result all the more disturbingly, the higher the operating frequency of the generator, which is observed with respect to the frequency and duty cycle, especially if the duty cycle can be selected freely. As will be shown hereinafter, in connection with FIG. 1 of the drawing herein, the cause of these undesirable deviations is primarily the delay between the ascertainment of a threshold critical for the system and the reaction of the system.

To meet this problem, the detrimental signal delay times can be shortened with additional circuitry cost, for example, by using a so-called unsaturated circuit technique in the construction of the generator, as well as by the higher current drain caused thereby. It would therefore be desirable to reduce both disadvantages and to avoid nevertheless, the disadvantage of the heretofore known squarewave generators of the type defined hereinbefore. It is accordingly an object of the invention to solve this problem.

To this end, the squarewave pulse generator defined at the introduction hereto is constructed, in accordance with the invention, in a manner that the terminal of the capacitor acted upon by the two constant-current sources is connected to a further current source which aids the constant-current source, causing the capacitor to be charged, and which responds with an auxiliary voltage $U_{H1}$ to an adjustable potential of this capacitor terminal, and that furthermore, the output of the Schmitt trigger is connected to the signal output of the generator through a decoupling element.

The effect of such a device is that the discharge of the capacitor below the desired threshold of the capacitor voltage is largely prevented.

It is then advantageous if, additionally, the pulse width of the squarewave voltage is corrected i.e. cut, for small duty cycles.

To this end, in accordance with a further feature of the invention, the capacitor terminal acted upon by the two constant-current sources is connected by a three-pole semiconductor switch to the input of a first inverter and the output of the latter is connected through a second inverter to the signal output of the generator.

Regarding the dimensioning of the three current sources, the following can be stated: If the current $I_1$ supplied by the first constant-current source serves for charging the capacitor, and the current $I_2$ supplied by the second constant-current source for discharging the capacitor, and if $I_3$ is the current supplied by the third current source, which is adjustable, the three current sources must be matched to one another so that $$I_3 > I_2 > I_1. \tag{1}$$

Other features which are considered as characteristic for the invention are set forth in the appended claims.

Although the invention is illustrated and described herein as embodied in a monolithically integrable squarewave pulse generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
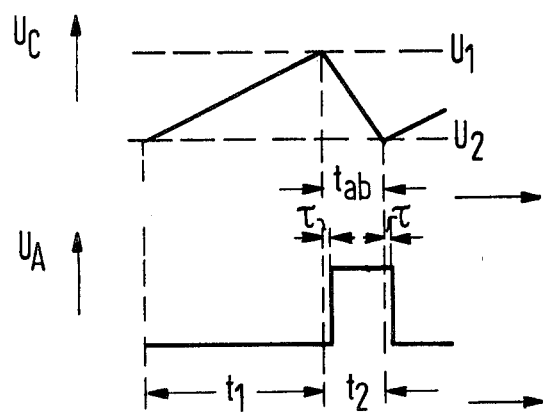
FIG. 1 is a plot diagram showing, at low frequencies, the behavior of the heretofore known squarewave pulse generators.

Referring now to the drawing, and first, particularly to FIG. 1 thereof, there is shown a sawtooth voltage $U_C$ at a capacitor C and a squarewave voltage $U_A$ derived therefrom, as are obtained at low frequencies by means of a squarewave pulse generator of the type described and defined at the introduction hereto. Voltages $U_1$ and $U_2$ indicate the upper and the lower threshold of $U_C$. Delay time $\tau$ is the delay between the recognition of a threshold and the reaction of the voltage $U_A$. The ratio $t_2/t_1$ determines the duty cycle. The pulse width of $U_A$ corresponds to the discharge time of the capacitor C between $U_1$ and $U_2$. It then follows:

Frequency $F = (t_1 + t_2)^{-1} = f(U_1, U_2, C)$

Pulse width $t_2 = t_{ab}$.

Figure 2:
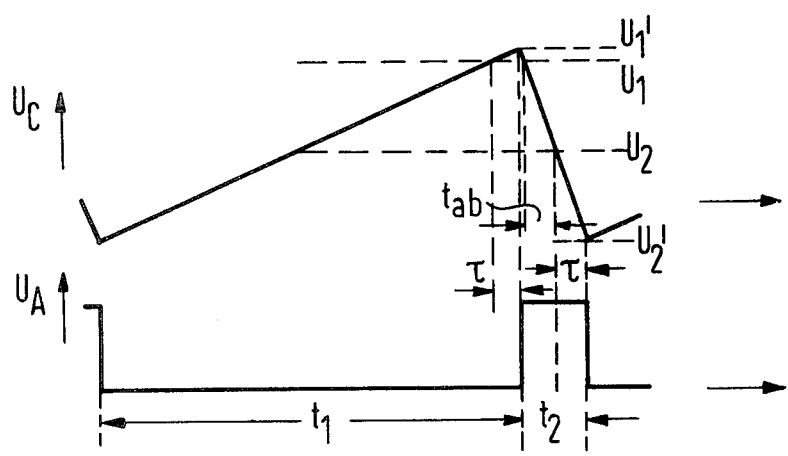
FIG. 2 is a diagram similar to that of FIG. 1 at higher frequencies.

The picture changes, as seen in FIG. 2, upon a transition to the operation of the conventional system at higher frequencies. Then we have:

Frequency $F = (t_1 + t_2)^{-1} = f(U'_1, U'_2, U_1, U_2, C) < f(U_1, U_2, C)$ and for the pulse width $t_2$ $t_2 = f(\tau, t_{ab}, U'_1) \approx t_{ab} + \tau_1$ $(U'_1 - U_1) < < (U_2 - U'_2)$ (for low duty cycle), the significance or meaning of the individual times and voltages being indicated in the figure because of the delay $\tau$, the discharge phase sets in too late. Therefore the capacitor voltage $U_c$, rises beyond $U_1$ to $U'_1$. Correspondingly, the discharge phase is terminated too late i.e. $U_C$ falls below $U_2$ to $U'_2$.

Figure 3:
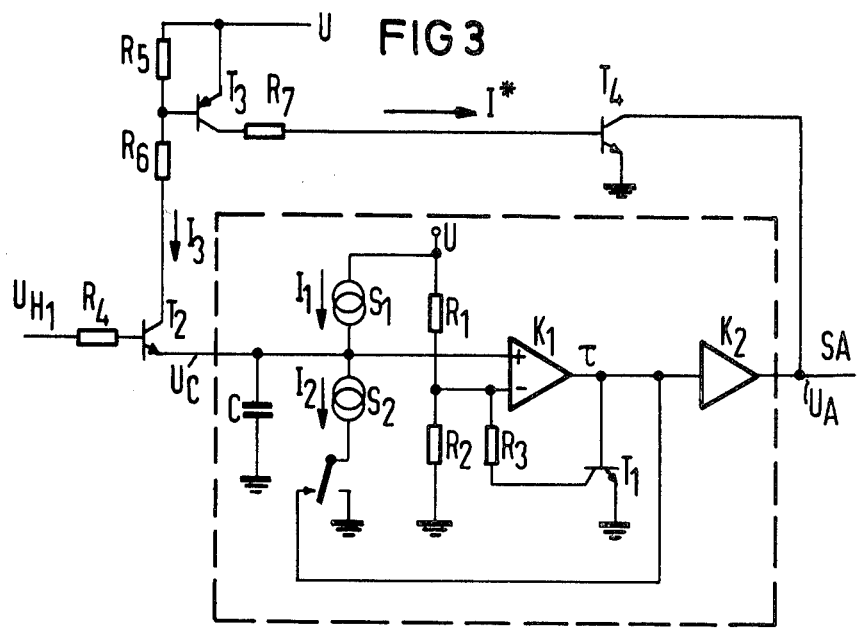
FIG. 3 is a circuit diagram of one embodiment of the monolithically integrable squarewave pulse generator according to the invention.

A preferred embodiment of a device according to the invention is shown in FIG. 3, to which reference is now made. That portion of the device in FIG. 3 which corresponds to the conventional construction is shown framed by broken lines, with the exception of the decoupling element $K_2$.

One terminal of the capacitor C, which determines or establishes the characteristic of the squarewave pulse generator, is connected to reference potential, i.e. ground; whereas the other terminal thereof is the point of attack of two constant-current sources $S_1$ and $S_2$, which are of conventional construction, the current source $S_1$ supplying the charging current $I_1$ and the current source $S_2$ the discharging current $I_2$. The terminal of the capacitor C acted upon by the two current sources $S_1$ and $S_2$ is further connected to the non-inverting input of an operational amplifier $K_1$ and, in addition, to the emitter of a bipolar transistor $T_2$ which represents the three-pole switch and is controlled by an auxiliary voltage $U_{H1}$.

The inverting input of the operational amplifier $K_1$ is connected via a voltage divider formed by the two resistors $R_1$ and $R_2$ to an operating potential U and is furthermore connected via the resistor $R_3$ to the collector of another bipolar translator $T_1$, the emitter of which is connected to reference potential (ground) and the base of which is tied to the output of the operational amplifier $K_1$, so that the operational amplifier $K_1$ is suitably supplemented to form a Schmitt trigger. Another feature of this arrangement is that the output of the Schmitt trigger can be fed back to the non-inverting input of the operational amplifier $K_1$ via a switch, particularly one realized by a transistor, and via the current source $S_2$.

Figure 8:
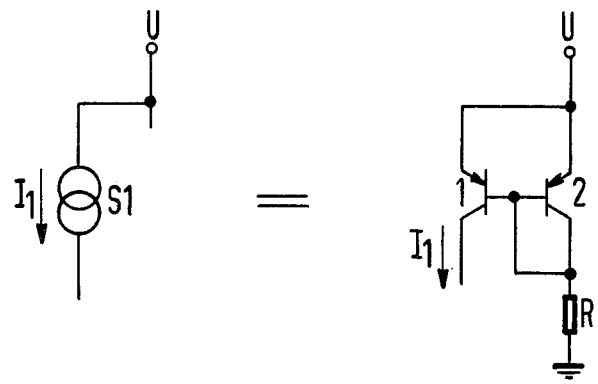
FIGS. 8 and 9 are circuit diagrams of embodiments of the current sources S1 and S2 of FIG. 3, respectively.
Figure 9:
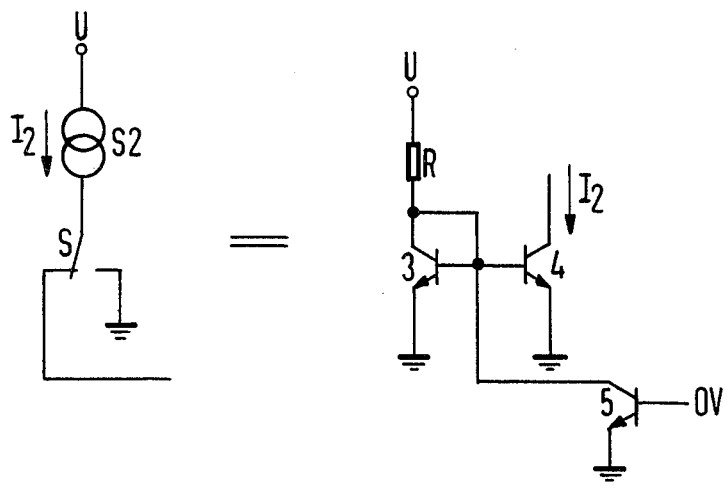

In the case of the embodiment of the invention shown in FIG. 3, the current source $S_1$ is realized by a pnp-transistor, the emitter of which (predominantly via a series resistor) is at reference potential and the collector of which is connected to the capacitor C and to the non-inverting input of the operational amplifier $K_1$, while the base is acted upon by an adjustable d-c potential. The same applies to the constant-current source $S_2$, except that, in the case of the embodiment of FIG. 3, an npn-transistor is provided therefor. FIG. 8 shows that the current source S1 may be in the form of two pnp transistors 1 and 2 which are connected together at their bases. The emitter of each transistor is connected to the operating potential U while the bases of the transistors and the collector of transistor 2 are connected through a resistor R to reference potential. FIG. 9 shows that the current source S2 may be in the form of two npn transistors 3 and 4 which are connected together at their bases as well. The emitter of each transistor is connected to reference potential while the collector of transistor 3 is connected through a resistor R to the operating potential U. The transistor 5 in FIG. 9 represents the switch which is diagrammatically shown in FIG. 3 to be connected to the current source S2. The switch which is given reference symbol S in FIG. 9 is an npn transistor with an emitter connected to reference potential, a collector connected to the bases of transistors 3 and 4 as well as to the collector of transistor 3, and a base which is at zero volts when the switch S is in the closed position. Such current sources are conveniently used in the art and the transistors 2 and 3 could also be omitted so that the bases of transistors 1 and 4 would be connected to a potential for determining the currents $I_1$ and $I_2$, such as from a voltage divider. The transistor $T_1$, which supplements the operational amplifier $K_1$ to form the Schmitt trigger, is an npn-transistor in the case of the embodiment of FIG. 3.

It is thus in keeping with the invention that the output of the Schmitt trigger is connected via a decoupling element to the signal output SA of the squarewave pulse generator. The decoupling element which, in its simplest form may be a transistor and, indeed, an npn-transistor in the case of the embodiment of FIG. 3, is provided in the system shown in FIG. 3 by a non-inverting amplifier $K_2$.

It is further in keeping with the invention that an additional current source is connected via the three-pole switch $T_2$ to the capacitor C in the hereinaforementioned sense. In the case of the embodiment of FIG. 3, the switching transistor $T_2$ is realized by an npn-transistor, the base of which is connected via a series resistor $R_4$ to an auxiliary voltage $U_{H1}$ and the collector of which is connected, via a voltage divider realized by the two resistors $R_5$ and $R_6$ and, indeed, through the series connection of the two resistors of the voltage divider, to the operating potential U.

By means of a bipolar transistor $T_3$ (in the case of the embodiment of FIG. 3, a pnp-transistor), the voltage divider is supplemented to form a first inverter, in that the base of the transistor $T_3$ is connected to the tap between $R_5$ and $R_6$ and the emitter is connected to the end point of the voltage divider at which the operating potential U, is applied. The output of the first inverter is realized by the collector of the transistor $T_3$.

The latter is connected via a resistor $R_7$ to the base of an additional bipolar transistor $T_4$ (in the case of the embodiment of FIG. 3, an npn-transistor) which represents the second inverter, the emitter of the transistor $T_4$ being connected to reference potential and the collector to the signal output SA and thus to the output of the decoupling element $K_2$.

With respect to the operation of the novel system, the following can be said: The current $I_1$ charges the capacity C up to the voltage $U_1$ and thereby provides the rising flank of a sawtooth voltage and consequently defines the pulse interval $t_1$. The current $I_2$ serves to discharge the capacitor C to the voltage $U_2$ and thus provides the falling flank of the sawtooth voltage, and thereby defines the pulse width $t_2$.

$$U_1 = U \cdot R_2/(R_1 + R_2) \text{ and } U_2 =$$

$$U \cdot \left( \frac{R_2 R_3}{(R_2 + R_3)} \right) / \left( \frac{R_2 R_3}{(R_2 + R_3)} + R_1 \right)$$

is effected by the operational amplifier $K_1$ acting as a comparator and the transistor $T_1$ with the delay $\tau$. Thereafter, the discharge of the capacitor C is initiated by switching-on the discharge current $I_2$.

The squarewave voltage $U_A$ is taken off via the decoupler $K_2$. The improvement of the function generator according to the invention is achieved primarily by the transistor $T_2$, $T_3$ and $T_4$ as well as by the resistors $R_5$, $R_6$ and $R_7$ in conjunction with the supply potential U and the auxiliary voltage $U_{H1}$.

The optimum value of the auxiliary voltage $U_{H1}$ for $U_2=2V$, for example, follows:

$$U_{H1} \sim 0.7V + 0.9 U_2 \sim 0.7V + \qquad (3)$$

$$0.9 \left( \frac{R_2 \cdot R_3}{R_2 + R_3} \right) / \left( \frac{R_2 \cdot R_3}{R_2 + R_3} \right) + R_1$$

Figure 4:
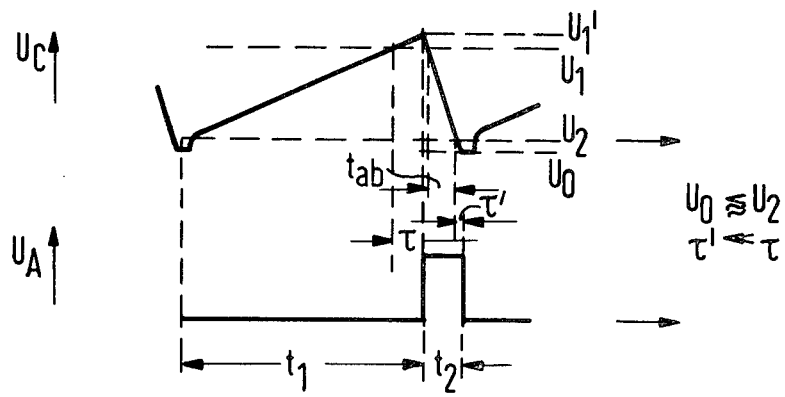
FIGS. 4 and 5 are diagrams similar to that of FIG. 2 showing the behavior of the embodiment of FIG. 3 at high frequencies.
Figure 5:
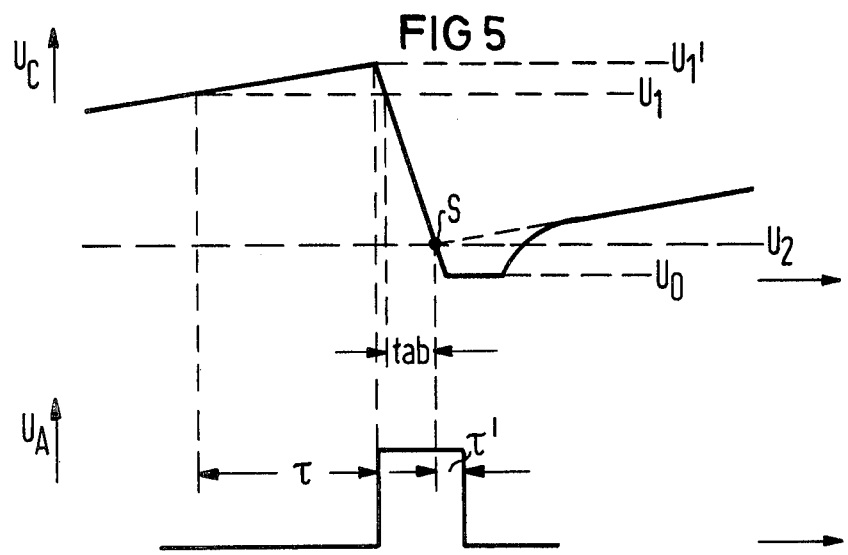

Then, as can be seen from FIG. 5 which is an enlarged fragmentary view of FIG. 4, the tangent to the linear portion of the shape of $U_C$, at the right-hand side of FIG. 5, intersects the falling flank of $U_C$ in a further frequency range in the vicinity of the threshold $U_2$ (intersection 3). The frequency is therefore influenced only little by the discharge of the capacitor C below the threshold $U_2$ to the voltage $U_0$.

As soon as the voltage $U_C$ has fallen below the switching threshold $U_2$ to the value of the auxiliary voltage $U_{H1}$ minus the base emitter threshold voltage of the switching transistor $T_2$, charging of the capacitor C by the current $I_3$ is effected, in addition to the regular discharge of the capacitor C by the current $I_2$, for which purpose $I_3 > I_2$, previously mentioned herein. This limits the discharge of the capacitor to the voltage $U_0$ (see FIG. 4 in comparison with FIGS. 1 and 2). The current $I_3$, which is set by the resistors $R_5$ and $R_6$, switches the transistor $T_3$ and, thereby, also the transistor $T_4$ via the resistor $R_7$ into condition after the delay time. Thus, the voltage jump of $U_A$ from the high to the low level is affected in a given time prior to switching through the decoupler $K_2$ to low output voltage.

There is virtually no increase in current drain of the generator due to the supplementation or improvement proposed by the invention in comparison to the conventional construction, because the circuit components which have been added to the previously known system become operative only at higher frequencies and the currents $I_3$ and $I_4$ are then only current pulses of brief duration.

The prevention of a discharge of the capacitor down to a range considerably below the desired threshold, which is ensured by a system according to the invention, and additional reduction of the pulse width for small duty cycles therefore increase the upper frequency limit in function generators without considerable expense of circuit means in comparison with that for heretofore known squarewave pulse generators. Thus, for example, it has been possible to raise a lower frequency limit below 25 kHz of a system constructed without the additional features proposed by the invention, to a frequency limit above 100 kHz by introducing the supplemental features mentioned hereinbefore.

The embodiment of a squarewave pulse generator corresponding to that of the invention shown in FIG. 3 is distinguished by its simplicity. One can arrive at more complicated possibilities, for example, through a different construction of the two inverters or the decoupler, but such variations, however, have at most small advantages over the embodiment described and illustrated hereinbefore, so that a discussion of such possibilities is believed to be unnecessary.

Figure 6:
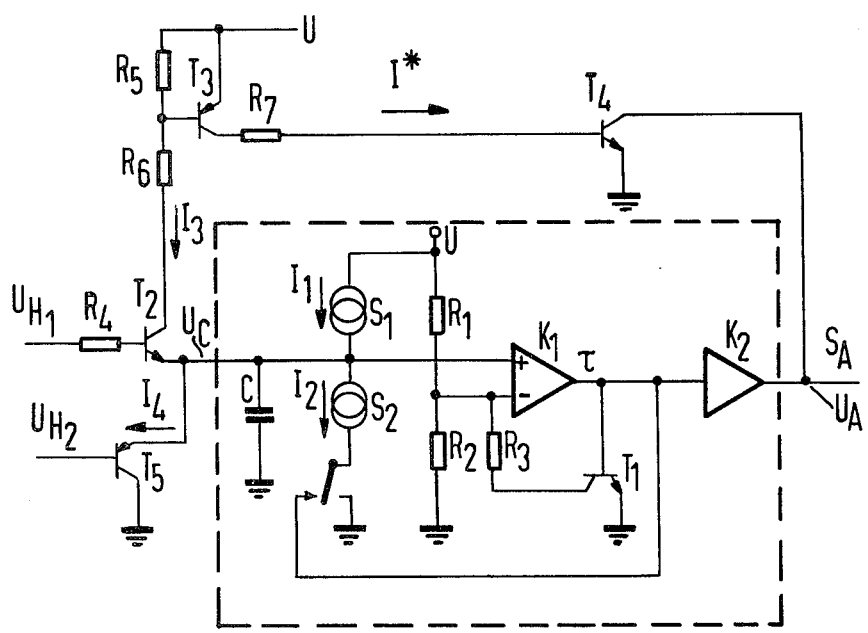
FIG. 6 is a circuit diagram like that of FIG. 3 of the embodiment of the invention supplemented in a manner similar to a shortfall so as to prevent the upper threshold of the capacitor voltage from being exceeded.

In addition to the three current source in the embodiment of FIG. 3, a fourth current source is required in the embodiment of FIG. 6, and represents a threshold switch controlled by an auxiliary voltage $U_{H2}$ and aiding the discharging current $I_2$. The current $I_4$ supplied by this fourth current source is adjusted so that it meets the requirements $$I_4 > I_1 \qquad (3).$$

The possibility of a further improvement of the invention mentioned hereinbefore, and realizable, as shown in FIG. 6, by connecting a fourth current source to the capacitor C, in principle, corresponds to a great extent to the previously described embodiment of the invention. In detail, what may be said about this additional improvement is that, after the capacitor voltage has surpassed the upper threshold $U_1$, the threshold switch formed of the transistor $T_5$, which is controlled by the auxiliary voltage $U_{H2}$, switches on the current $I_4$ and thereby prevents further charging of the capacitor C.

The circuit of this improved second embodiment of the invention shown in FIG. 6 corresponds to that of FIG. 3, with the addition of a pnp-transistor $T_5$, the emitter of which is connected to the terminal of the capacitor C, which is acted upon by the constant-current sources and is connected to the emitter of the npn-transistor $T_2$ as well as to the non-inverting input of the operational amplifier $K_1$, while the collector of the transistor $T_5$ is at reference potential (ground) and the base thereof at the auxiliary voltage $U_{H2}$.

In the embodiments of the invention heretofore described, the duty cycle i.e. the ratio $t_2/t_1$, is smaller than 1. If the duty cycle is greater than 1, it is advantageous to use a further modification of the circuits shown in FIGS. 3 and 6, respectively, namely that of FIG. 7. In this embodiment of FIG. 7, the Schmitt trigger made up of the operational amplifier $K_1$ and the transistor $T_1$ corresponds to the construction thereof in FIG. 3. The same is true for the connection of the capacitor C. Since, contrary to the embodiment according to FIG. 3, the charging current and not the discharging current is switched in the embodiment of FIG. 7, the role of the constant-current sources supplying the currents $I_1$ and $I_2$ is interchanged. This means that the current $I_2$ to be switched serves in the embodiment of FIG. 7 as the charging current and the current, which is not to be switched, as the discharging current. With respect to the circuit of FIG. 7, it is also noted that the bipolar transistor $T_2$ which is to be controlled at the base thereof by the auxiliary voltage $U_{H1}$, is of the pnp type, and the emitter of the transistor $T_2$ is connected to the stated terminal of the capacitor C, while the collector, via a resistor $R_8$, is connected to reference potential (ground), the auxiliary voltage $U_{H1}$ being applied to the base of the transistor $T_2$ via a series resistor $R_4$.

Figure 7:
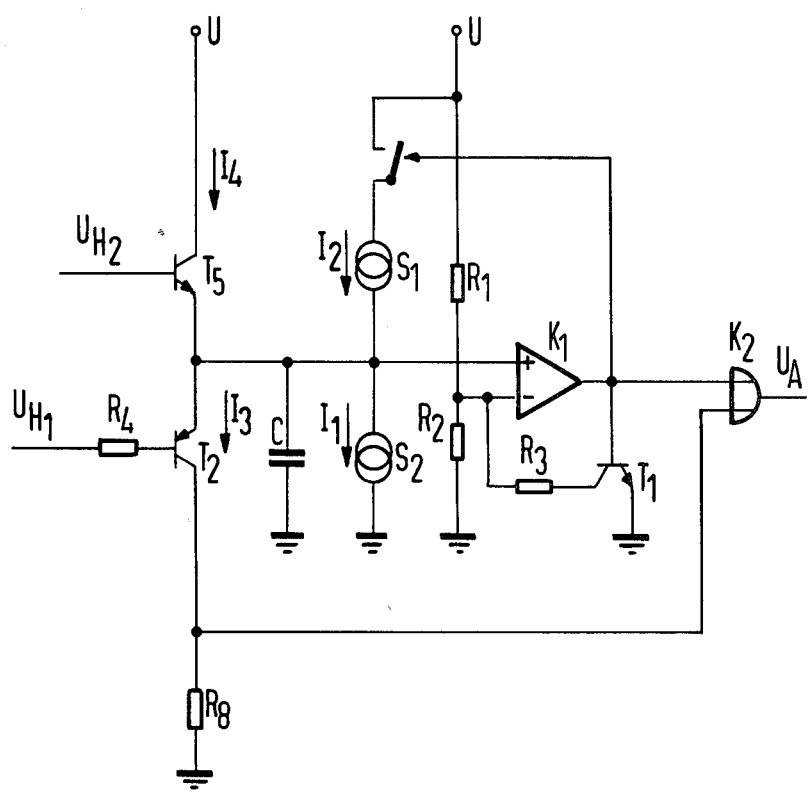
FIG. 7 is a circuit diagram of another embodiment of the invention.

The circuit output is further realized by an OR gate $K'_2$ in FIG. 7, the one input of which is addressed by the output of the Schmitt trigger and the second input by the collector of the switching transistor $T_2$. The transistor $T_2$ supplies the current $I_3$.

An npn-transistor $T_5$, which can be controlled at the base thereof by the auxiliary voltage $U_{H2}$, is connected by the collector thereof to the operating potential U and by the emitter thereof to the terminal of the capacitor which, in turn, is also connected to the non-inverting input of the operational amplifier $K_1$ and to the emitter of the transistor $T_2$. This transistor $T_5$ carries the current $I_4$.

The circuit must be laid out so that the condition $I_3 > I_2 > I_1$ and $I_4 > I_1$ are met.

The reason for replacing the amplifier $K_2$ of FIGS. 3 and 6 with an OR gate $K_2'$ in FIG. 7 is that in the arrangement according to FIG. 3, for example, the signal output voltage $U_A$ must be brought from the level HIGH to the level LOW, while in the arrangement according to FIG. 7, exactly the reverse is proposed.

I claim:

1. In a monolithically integrable squarewave pulse generator having a capacitor acted upon by two bucking constant-current sources, the capacitor having one terminal connected to the two constant-current sources as well as to a non-inverting input of an operational amplifier connected as a Scmitt trigger, and the capacitor having another terminal tied to reference potential, one of the constant-current sources being operative for charging the capacitor, the improvement comprising a third current source in the form of a transistor being normally off and having an electrode connected to the one capacitor terminal connected to the two constant-current sources and a base and an auxiliary voltage source connected to the base of the said third current source transistor for firing said third current source transistor during the discharge period of the capacitor because of the difference in potential between the base thereof and the capacitor, the Schmitt trigger having an output connected to signal output of the squarewave pulse generator.

2. Pulse generator according to claim 1 wherein the constant-current sources are matched to one another so that a current $I_1$ supplied by the one constant-current source for charging the capacitor has the following relationship to a current $I_2$ supplied by the second constant-current source for discharging the capacitor and to an adjustable current $I_3$ supplied by said third current source:

$$I_3 > I_2 > I_1.$$

3. Pulse generator according to claim 1 including two serially connected inverters acted upon by a common operating potential and reference potential, the one capacitor terminal connected to the two constant-current sources being tied through said third current source transistor to an input of one of said inverters, said one inverter having an output tied through the other of said inverters to signal output of the pulse generator.

4. Pulse generator according to claim 3 wherein said third current source transistor is a bipolar transistor and the electrode thereof is an emitter being also connected to the non-inverting output of said operational amplifier and including another electrode thereof being a collector connected to both of said inverters.

5. Pulse generator according to claim 4 wherein said auxiliary voltage is applied over a series resistance connected to said base of said bipolar transistor.

6. Pulse generator according to claim 4 wherein one electrode of said bipolar transistor is tied through a resistor to a circuit node, said circuit node being tied to operating potential through another resistor and to the emitter-base path of one of said inverters in the form of another bipolar transistor connected in parallel with said other resistor, said other bipolar transistor having a collector connected via a third resistor to the base of the other of said inverters in the form of another transistor, said other transistor having an emitter tied to operating potential and a collector connected to signal output of the pulse generator.

7. Pulse generator according to claim 6 wherein a bipolar transistor supplementing said operational amplifier to said Schmitt-trigger and located between the inverting input and output of said operational amplifier, as well as said bipolar transistor forming said third current source transistor and said other of said inverters which is also formed as a transistor are all of the npn-type; and said one of said inverters being in the form of a transistor of the pnp-type.

8. Pulse generator according to claim 7 including yet another bipolar transistor complementary to said bipolar transistor forming said third current source transistor having mutually connected emitters, said complementary transistor having a base to which an auxiliary voltage is applied and a collector to which reference potential is applied.

9. Pulse generator according to claim 2 including a first bipolar transistor serving as said third current source transistor having a base to which an auxiliary voltage is applied, a collector at reference potential, and an emitter connected both to the one terminal of the capacitor connected to the two constant-current sources to which the charging current $I_1$ and discharging current $I_2$ are applied as well as to an emitter of a second bipolar transistor, complementary to said first bipolar transistor, said second bipolar transistor having a collector tied to reference potential and a base to a further auxiliary voltage, an OR-gate forming the signal output of the pulse generator and having two inputs, said collector of said first bipolar transistor forming said third current source transistor connected to one of said inputs of said OR-gate, and said output of said Schmitt trigger to the other of said inputs of said OR-gate, and all of the components of the pulse generator being of such dimension that both ,f the currents $I_1$ and $I_2$ delivered by said constant-current sources to the capacitor, as well as a third current $I_3$ fed through said first bipolar transistor serving as said third current source transistor as well as a fourth current $I_4$ passing through a third bipolar transistor complementary to said first bipolar transistor serving as said third current source transistor have the mutual relationship $$I_3 > I_2 > I_1 \text{ and } I_4 > I_1.$$

10. Pulse generator according to claim 1, including a decoupling element connected between the output of Schmitt trigger and signal output of the squarewave pulse generator.

* * * * *